(12) United States Patent
Sun et al.

(10) Patent No.: US 12,393,086 B2
(45) Date of Patent: Aug. 19, 2025

(54) DISPLAY SUBSTRATE, DISPLAY PANEL, AND DISPLAY DEVICE

(71) Applicants: Beijing BOE Optoelectronics Technology Co., Ltd., Beijing (CN); BOE Technology Group Co., Ltd., Beijing (CN)

(72) Inventors: Zepeng Sun, Beijing (CN); Xianglei Qin, Beijing (CN); Jinshuai Duan, Beijing (CN); Yong Zhang, Beijing (CN); Xiaojuan Wu, Beijing (CN); Limin Zhang, Beijing (CN); Zhilong Duan, Beijing (CN); Zhiqiang Yu, Beijing (CN); Liangzhen Tang, Beijing (CN); Honggui Jin, Beijing (CN); Ruomei Bian, Beijing (CN); Zhaohu Yu, Beijing (CN); Xing Xu, Beijing (CN); Wulin Zhang, Beijing (CN); Xiaofeng Yin, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/560,412

(22) PCT Filed: May 14, 2021

(86) PCT No.: PCT/CN2021/093771
§ 371 (c)(1),
(2) Date: Nov. 13, 2023

(87) PCT Pub. No.: WO2022/236798
PCT Pub. Date: Nov. 17, 2022

(65) Prior Publication Data
US 2024/0248359 A1  Jul. 25, 2024

(51) Int. Cl.
G02F 1/1362 (2006.01)
G02F 1/1368 (2006.01)

(52) U.S. Cl.
CPC .. *G02F 1/136286* (2013.01); *G02F 1/136209* (2013.01); *G02F 1/136227* (2013.01); *G02F 1/1368* (2013.01)

(58) Field of Classification Search
CPC ....... H01L 27/12; H01L 21/77; G02F 1/1368; G02F 1/136227; G02F 1/136209; G02F 1/136286
See application file for complete search history.

(56) References Cited

U.S. PATENT DOCUMENTS

2016/0155755 A1  6/2016  Liu et al.
2019/0074299 A1*  3/2019  Yamashita .......... H01L 23/5329
(Continued)

FOREIGN PATENT DOCUMENTS

CN  206479966 U  9/2017
CN  109671726 A  4/2019
(Continued)

OTHER PUBLICATIONS

International Search Report for PCT/CN2021/093771 Mailed Jan. 6, 2022.

*Primary Examiner* — Mariam Qureshi
(74) *Attorney, Agent, or Firm* — Ling Wu; Stephen Yang; Ling and Yang Intellectual Property

(57) ABSTRACT

A display substrate comprises a substrate; a first electrode layer; comprises: multiple first signal lines; the first insulating layer comprises multiple first via holes, orthographic projections of the first via holes on the substrate fall into orthographic projections of the first signal lines on the substrate; a second electrode layer including multiple first connection electrodes; the first connecting electrode is connected with the first signal line through the first via hole; the (Continued)

second insulating layer is on the side, away from the first insulating layer, of the second electrode layer and comprises multiple second via holes; the orthographic projection of the second via hole on the substrate falls into the orthographic projection of the first connecting electrode on the substrate, and the orthographic projection of the second via hole on the substrate and the orthographic projection of the first via hole on the substrate are arranged in a staggered manner.

19 Claims, 4 Drawing Sheets

(56) References Cited

U.S. PATENT DOCUMENTS

| | | | |
|---|---|---|---|
| 2019/0229130 A1* | 7/2019 | Ma | H10D 86/60 |
| 2020/0150472 A1* | 5/2020 | Kikuchi | G09G 3/3644 |
| 2021/0098503 A1 | 4/2021 | Ding et al. | |
| 2021/0103350 A1* | 4/2021 | Fujita | G02F 1/1368 |
| 2021/0333667 A1 | 10/2021 | Tian et al. | |

FOREIGN PATENT DOCUMENTS

| | | |
|---|---|---|
| CN | 110634793 A | 12/2019 |
| CN | 112735262 A | 4/2021 |

* cited by examiner

DISPLAY SUBSTRATE, DISPLAY PANEL, AND DISPLAY DEVICE

CROSS-REFERENCE TO RELATED APPLICATION

The present application is a U.S. National Phase Entry of International Application PCT/CN2021/093771 having an international filing date of May 14, 2021, and entitled "Display Substrate, Display Panel, and Display Device", the contents of which are hereby incorporated herein by reference in their entireties.

TECHNICAL FIELD

The present disclosure relates to the field of display technologies, in particular to a display substrate, a display panel, and a display device.

BACKGROUND

With development of electronic technologies and continuous improvement of people's living standards, liquid crystal display devices, which are specifically electronic computers, mobile phones, tablet computers and other electronic devices for example, have been widely used in people's daily work and life. A liquid crystal display device includes an array substrate and an opposite substrate arranged opposite to the array substrate. In a design scheme, pixel electrodes, a common electrode and a common voltage signal line are all on the array substrate. The common electrode and the common voltage signal line are usually located in different layers and are required to be electrically connected through a via hole. However, in the prior art, due to a large dimension of the via hole for electrically connecting the common electrode and the common voltage signal line, and a black matrix in the opposite substrate required to cover an edge of the via hole, a dimension of the black matrix is large, resulting in a low PPI (Pixels Per Inch) of the liquid crystal display device.

SUMMARY

A display substrate is provided in an embodiment of the present disclosure. The display substrate includes:
 a base substrate, including a display region and a peripheral region outside the display region;
 a first electrode layer, which is located on a side of the base substrate and includes a plurality of first signal lines extending from the display region to the peripheral region;
 a first insulation layer, which is located on a side of the first electrode layer facing away from the base substrate and includes a plurality of first via holes penetrating a thickness of the first insulation layer, wherein an orthographic projection of the first via holes on the base substrate falls within an orthographic projection of the first signal lines on the base substrate;
 a second electrode layer, which is located on a side of the first insulation layer facing away from the first electrode layer and includes a plurality of first connection electrodes located in the display region; wherein the first connection electrodes are connected to the first signal lines through the first via holes;
 a second insulation layer, which is located on a side of the second electrode layer facing away from the first insulation layer and includes a plurality of second via holes penetrating a thickness of the second insulation layer; wherein an orthographic projection of the second via holes on the base substrate falls within an orthographic projection of the first connection electrodes on the base substrate, and the orthographic projection of the second via holes on the base substrate and the orthographic projection of the first via holes on the base substrate are arranged in a staggered manner; and
 a third electrode layer, which is located on a side of the second insulation layer facing away from the second electrode layer and includes a plurality of first electrodes located in the display region, wherein the first electrodes are electrically connected to the first connection electrodes through the second via holes.

In some embodiments, in each first via hole, a first connection electrode is electrically connected to a portion of a first signal line exposed from the first via hole.

In some exemplary embodiments, an orthographic projection of a second via hole on the base substrate is partially overlapped with an orthographic projection of the first via hole on the base substrate.

In some embodiments, a region where the orthographic projection of the first via hole on the base substrate is overlapped with the orthographic projection of the second via hole on the base substrate falls within an orthographic projection of a region where the first connection electrode is electrically connected to the first signal lines, on the base substrate.

In some embodiments, a contact area of the first connection electrode with the first signal line is greater than or equal to 9 square microns and less than or equal to 20 square microns.

In some embodiments, the first electrode layer further includes a source and a drain of a thin film transistor, and a plurality of data signal lines electrically connected to the source. An extending direction of the data signal lines is the same as an extending direction of the first signal lines.

The first insulation layer further includes a third via hole penetrating the thickness of the first insulation layer and exposing the drain.

The second electrode layer further includes a pixel electrode electrically connected to the drain through the third via hole.

A minimum distance between any pixel electrode and first connection electrode which are adjacent is greater than or equal to 4.5 microns.

In some embodiments, an area of the orthographic projection of the first via hole on the base substrate is greater than or equal to 29 square microns and less than or equal to 59 square microns.

An area of an orthographic projection of the third via hole on the base substrate is greater than or equal to 29 square microns and less than or equal to 59 square microns.

An area of the orthographic projection of the second via hole on the base substrate is greater than or equal to 18 square microns and less than or equal to 38 square microns.

An area of the region where the orthographic projection of the second via hole on the base substrate is overlapped with the orthographic projection of the first via hole on the base substrate is greater than or equal to 7 square microns, and less than or equal to 26 square microns.

In some embodiments, the display substrate further includes:
 a fourth electrode layer, which is located between the base substrate and the first electrode layer, and includes a plurality of first gate drive signal lines located in the peripheral region;

wherein a plurality of first signal lines are intersected with a plurality of second signal lines; and a third insulation layer located between the fourth electrode layer and the first electrode layer;

The first electrode layer further includes a plurality of second gate drive signal lines located in the peripheral regions.

The first insulation layer further includes a plurality of fourth via holes penetrating a thickness of the first insulation layer and exposing the second gate drive signal lines.

The first insulation layer and the third insulation layer further include a plurality of fifth via holes penetrating the first insulation layer and the third insulation layer and exposing the first gate drive signal lines.

The second electrode layer further includes a plurality of gate drive circuit connection leads located in the peripheral region, wherein each of the gate drive circuit connection leads is electrically connected to one of the first gate drive signal lines through a fifth via hole and to one of the second gate drive signal lines through a fourth via hole.

In some embodiments, the second insulation layer further includes sixth via holes penetrating the thickness of the second insulation layer and exposing the first connection electrodes.

The third electrode layer further includes a plurality of bonding electrodes located in the peripheral region, wherein the bonding electrodes are electrically connected to the gate drive circuit connection leads through the sixth via holes.

A display panel is provided in an embodiment of the present disclosure. The display panel includes:

the display substrate provided in the embodiments of the present disclosure;

an opposite substrate disposed opposite to the display substrate; and a liquid crystal layer located between the display substrate and the opposite substrate.

In some embodiments, the opposite substrate includes:

a black matrix, wherein an orthographic projection of the black matrix on the base substrate of the display substrate covers the orthographic projection of the first via holes of the display substrate on the base substrate, and covers the orthographic projection of the second via holes of the display substrate on the base substrate.

In some embodiments, a minimum distance between an edge of the black matrix and the first via holes covered by the black matrix in the extending direction of the first signal lines of the display substrate is greater than or equal to 1.9 microns.

In some embodiments, a width of the black matrix is greater than or equal to 20.8 microns and less than or equal to 26 microns in the extending direction of the first signal lines of the display substrate.

A display device is further provided in an embodiment of the present disclosure, which includes the display panel provided in the embodiments of the present disclosure.

BRIEF DESCRIPTION OF DRAWINGS

In order to describe technical solutions in embodiments of the present disclosure more clearly, the drawings to be used in the embodiments will be introduced below in brief. Apparently, the drawings described below are only some of the embodiments of the present disclosure, and one skilled in the art may obtain other drawings according to these drawings without paying any inventive effort.

DETAILED DESCRIPTION

Figure 1:
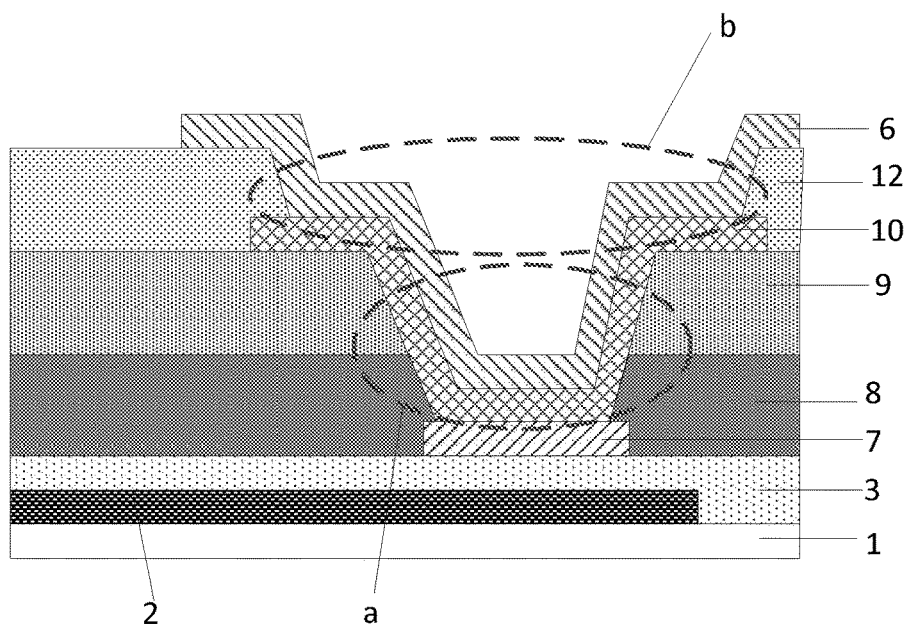
FIG. 1 is a schematic diagram of a structure of a display substrate according to related arts.

In order to make objectives, technical solutions and advantages of the embodiments of the present disclosure more clear, the technical solutions of the embodiments of the present disclosure will be clearly and completely described below with reference to the drawings of the embodiments of the present disclosure. Apparently, the described embodiments are a part of the embodiments of the present disclosure, not all of the embodiments. Furthermore, the embodiments of the present disclosure and features in the embodiments may be combined randomly with each other if there is no contradiction. Based on the described embodiments of the present disclosure, all other embodiments obtained by those of ordinary skills in the art without paying any inventive effort are within the protection scope of the present disclosure.

Unless otherwise defined, technical terms or scientific terms used in the present disclosure should have the meanings as commonly understood by those of ordinary skill in the art to which the present disclosure pertains. The "first", "second" and similar terms used in the present disclosure do not indicate any order, quantity, or importance, but are used only for distinguishing different components. "Include", "contain", or a similar word mean that elements or objects appearing before the word cover elements or objects listed after the word and their equivalents, but do not exclude other elements or objects. "Connect", "join", or a similar term is not limited to a physical or mechanical connection, but may include an electrical connection, whether direct or indirect.

It should be noted that sizes and shapes of various figures in the drawings do not reflect actual scales, and are only for the purpose of schematically illustrating contents of the present disclosure. Moreover, same or similar elements and elements having same or similar functions are denoted by same or similar reference numerals throughout the descriptions.

In related arts, as shown in FIG. 1, a display substrate of a liquid crystal display panel includes a base substrate 1, a gate metal layer 2, a gate insulation layer 3, a common voltage signal line 7, a buffer layer 8, a resin layer 9, a first indium tin oxide layer 10, a passivation layer 12, and a common electrode 13. The first indium tin oxide layer 10 is lapped with the common voltage signal line 7 through a via hole a penetrating through the resin layer 9 and the buffer layer 8, and the common electrode 13 is lapped with the first indium tin oxide layer 10 through a via hole b penetrating through the passivation layer 12, thereby achieving electrical connection between the common electrode 13 and the common voltage signal line 7. In practice, an orthographic projection of the via hole a on the base substrate 1 falls into an orthographic projection of the via hole b on the base substrate. That is, the via hole b is required to cover the via hole a, which leads to a large area occupied by the via holes. Generally, a via hole of a common electrode and a common voltage signal line is required to be covered by a black matrix. Therefore, a large area occupied by the via hole leads to a large dimension of the black matrix, which affects an area of a region not covered by the black matrix and leads to a low aperture ratio of the display panel.

Figure 3:
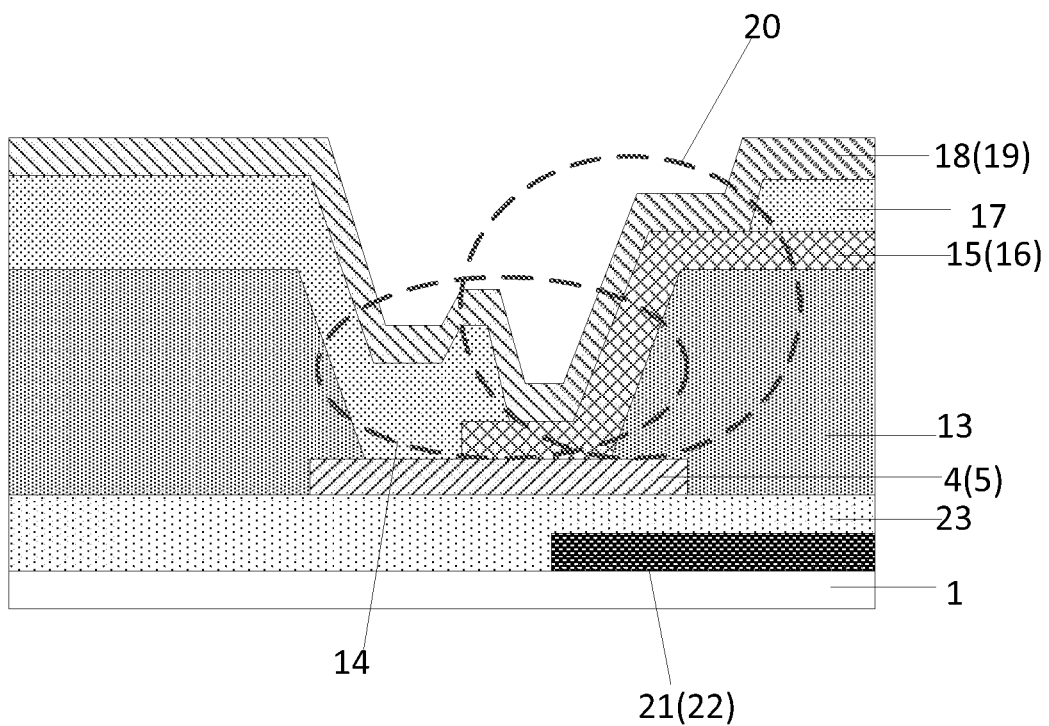
FIG. 3 is a schematic diagram of a structure of a display substrate according to an embodiment of the present disclosure.

Based on the above-mentioned technical problem existing in the related technologies, a display substrate is provided in an embodiment of the present disclosure. As shown in FIG. 3, the display substrate includes:

- a base substrate 1 including a display region B and a peripheral region C outside the display region B;
- a first electrode layer 4 which is located on a side of the base substrate 1 and includes a plurality of first signal lines 5 extending from the display region to the peripheral region;
- a first insulation layer 13 which is located on a side of the first electrode layer 4 facing away from the base substrate 1 and includes a plurality of first via holes 14 penetrating a thickness of the first insulation layer 4, wherein an orthographic projection of the first via holes 14 on the base substrate 1 falls within an orthographic projection of the first signal lines 5 on the base substrate;
- a second electrode layer 15 which is located on a side of the first insulation layer 13 facing away from the first electrode layer 4 and includes a plurality of first connection electrodes 16 located in the display region; wherein the first connection electrodes 16 are connected to the first signal lines 5 through the first via holes 14;
- a second insulation layer 17 which is located on a side of the second electrode layer 15 facing away from the first insulation layer 13 and includes a plurality of second via holes 20 penetrating a thickness of the second insulation layer 17; wherein an orthographic projection of the second via holes 20 on the base substrate 1 falls within an orthographic projection of the first connection electrodes 16 on the base substrate 1, and the orthographic projection of the second via holes 20 on the base substrate 1 and the orthographic projection of the first via holes 14 on the base substrate 1 are arranged in a staggered manner; and
- a third electrode layer 18 which is located on a side of the second insulation layer 17 facing away from the second electrode layer 15 and includes a plurality of first electrodes 19 located in the display region, wherein the first electrodes 19 are electrically connected to the first connection electrodes 16 through the second via holes 20.

According to the display substrate provided in the embodiment of the present disclosure, the orthographic projection of the first via holes on the base substrate and the orthographic projection of the second via holes on the base substrate are arranged in a staggered manner. That is, the orthographic projection of the second via holes on the base substrate does not necessarily completely cover and surround the orthographic projection of the first via holes on the base substrate. Therefore, in the display substrate provided in the embodiment of the present disclosure, an area of the second via holes can be reduced compared with related technologies, so that an area of a region where the black matrix covers the first via holes and the second via holes can be reduced when the display substrate is applied to a liquid crystal display product, and an area of a region not covered by the black matrix can be improved, thereby improving the aperture ratio of the display product, and improving a display effect of the display product.

Figure 4:
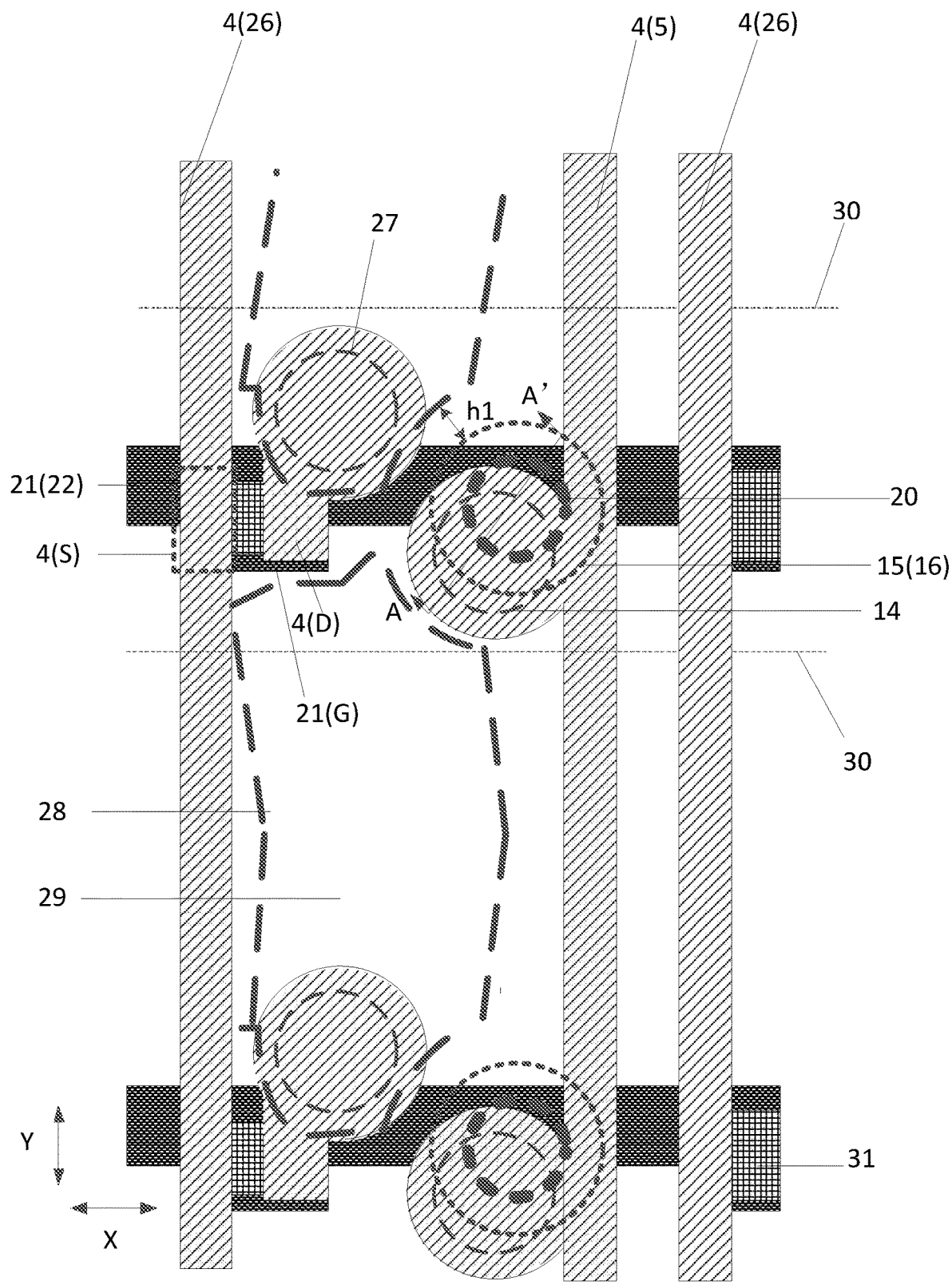
FIG. 4 is a schematic diagram of a structure of another display substrate according to an embodiment of the present disclosure.

In some exemplary embodiments, as shown in FIGS. 3 and 4, an orthographic projection of a second via hole 20 on the base substrate 1 is partially overlapped with an orthographic projection of a first via hole 14 on the base substrate 1.

It should be noted that only part of the first signal lines, second signal lines and data signal lines are shown in FIG. 4. In order to show a positional relationship between the first electrode layer and the via holes, a film layer on a side of the first electrode layer facing away from the base substrate is not shown, and the first via holes, the second via holes and the first connection electrodes are only marked with dashed lines to indicate their respective positions. FIG. 3 may be a cross-sectional view taken along A-A' line in FIG. 4 for example.

In some exemplary embodiments, as shown in FIGS. 3 and 4, an orthographic projection of a first connection electrode 16 on the base substrate 1 is partially overlapped with the orthographic projection of the first via hole 14 on the base substrate 1. In first via hole 14, the first connection electrode 16 is electrically connected to a portion of a first signal line 5 exposed from the first via hole 14.

That is, according to the display substrate provided in the embodiment of the present disclosure, the first connection electrodes do not completely cover the first via holes, and the first connection electrodes are lapped with portions of the first signal lines exposed from the first via holes. Since the orthographic projection of the first via holes on the base substrate is partially overlapped with the orthographic projection of the first connection electrodes on the base substrate, an area of the first via holes can also be reduced. Moreover, since the orthographic projection of the second via holes on the base substrate falls within the orthographic projection of the first connection electrodes on the base substrate, an area of a region where the first connection electrodes cover the first via holes in the present disclosure is reduced compared with the related technologies, and the area of the second via holes can be further reduced accordingly. That is, the area of the region where the black matrix covers the first via holes and the second via holes can be further reduced, and the area of the region not covered by the black matrix can be further improved, thereby improving the aperture ratio of the display product and improving the display effect of the display product.

In some embodiments, as shown in FIGS. 3 and 4, a region where the orthographic projection of the first via hole 14 on the base substrate 1 is overlapped with the orthographic projection of the second via hole 20 on the base substrate 1 falls within an orthographic projection of a region where the first connection electrode 16 is electrically connected to the first signal line 5, on the base substrate 1.

In some embodiments, an area of the orthographic projection of the first via hole on the base substrate is greater than or equal to 29 square microns and less than or equal to 59 square microns.

It should be noted that in the prior art, the area of the first via hole is usually 86 square microns. According to the display substrate provided in the embodiment of the present disclosure, the orthographic projection of the first via hole on the base substrate is partially overlapped with the orthographic projection of the first connection electrode on the base substrate, such that the area of the orthographic projection of the first via hole on the base substrate can be reduced to a range of 29 square microns to 59 square microns, thus greatly reducing the area of the first via holes and the area of the region where the black matrix covers the first via holes in the embodiment of the present disclosure compared with the prior art, thereby improving the area of the region not covered by the black matrix and improving the aperture ratio of the display product.

In some embodiments, the area of the orthographic projection of the first via hole on the base substrate is 44 square microns.

In some embodiments, an area of the orthographic projection of the second via hole on the base substrate is greater than or equal to 18 square microns and less than or equal to 38 square microns.

In some embodiments, the area of the orthographic projection of the second via hole on the base substrate is 28 square microns.

In some embodiments, an area of a region where the orthographic projection of the second via hole on the base substrate is overlapped with the orthographic projection of the first via hole on the base substrate is greater than or equal to 7 square microns, and less than or equal to 261 square microns.

It should be noted that, in the prior art, the area of the region where the orthographic projection of the second via hole on the base substrate is overlapped with the orthographic projection of the first via hole on the base substrate is usually 400 square microns, because the orthographic projection of the second via hole is required to completely cover the orthographic projection of the first via hole, that is, the area of the second via hole needs to be greater than 400 square microns. According to the display substrate provided in the embodiments of the present disclosure, the orthographic projection of the first via hole on the base substrate is overlapped with the orthographic projection of the second via hole on the base substrate partially, the area of the orthographic projection of the second via hole on the base substrate is reduced to a range of 18 square microns to 38 square microns, and the area of the overlapping region is reduced to a range of 7 square microns to 261 square microns. According to the embodiments of the present disclosure compared with the prior art, the area of the region where the first via holes and the second via holes are overlapped can be greatly reduced, such that the area of the region where the black matrix covers the first via holes can be reduced, thereby improving the area of the region not covered by the black matrix and improving the aperture ratio of the display product.

In some embodiments, an area of the region where the orthographic projection of the second via hole on the base substrate is overlapped with the orthographic projection of the first via hole on the base substrate is 169 square microns.

In some embodiments, a contact area of the first connection electrode with the first signal line is greater than or equal to 9 square microns and less than or equal to 20 square microns.

In this way, a small contact area of the first connection electrode with the first signal line can be avoided, such that while the first connection electrode is partially lapped with the first signal line to reduce the area of the second via hole, lapping resistance of the first connection electrode with the first signal line can be ensured, thereby ensuring an electrical connection performance between the first connection electrode and the first signal line, and ensuring a signal transmission effect.

In some embodiments, the contact area of the first connection electrode with the first signal line is 19.36 square microns.

In practice, the first electrode may be, for example, a common electrode, and a corresponding first signal line may be, for example, a common electrode signal line. The common electrode is electrically connected to the common electrode signal line through a first connection electrode so that a signal can be supplied to the common electrode through the common electrode signal line.

In some embodiments, as shown in FIG. 4, the first electrode layer 4 further includes a source S and a drain D of a thin film transistor, and a plurality of data signal lines 26 electrically connected to the source S. An extending direction of the data signal lines 26 is the same as an extending direction of the first signal lines 5.

The first insulation layer 13 further includes a third via hole 27 penetrating the thickness of the first insulation layer 13 and exposing the drain.

The second electrode layer 15 further includes a pixel electrode 28 electrically connected to the drain D through the third via hole 27.

A minimum distance between any adjacent pixel electrode and first connection electrode 16 is greater than or equal to 4.5 microns.

In this way, conduction between pixel electrodes and first connection electrodes disposed in a same layer can be avoided.

In some embodiments, an area of an orthographic projection of the third via hole on the base substrate is greater than or equal to 29 square microns and less than or equal to 59 square microns.

In practice, the area of the third via hole may be equal to the area of the first via hole.

In some embodiments, as shown in FIG. 4, both of the data signal lines 26 and the first signal lines 4 extend in a first direction Y, and the plurality of data signal lines 26 and the plurality of first signal lines 4 are all arranged in a second direction.

In some embodiments, as shown in FIGS. 3 and 4, the display substrate further includes:
  a fourth electrode layer 21 which is located between the base substrate 1 and the first electrode layer 4 and includes a gate G of a thin film transistor located in the display region, and a plurality of second signal lines 22 extending from the display region to the peripheral region; and
  a third insulation layer 23 located between the fourth electrode layer 21 and the first electrode layer 4.

In some embodiments, the thin film transistor has a bottom gate structure. That is, as shown in FIG. 3, the third insulation layer 23 is a gate insulation layer.

When the thin film transistor has the bottom gate structure, as shown in FIG. 4, the display substrate further includes an active layer 31 that is located between the gate insulation layer and the first electrode layer.

Figure 5:
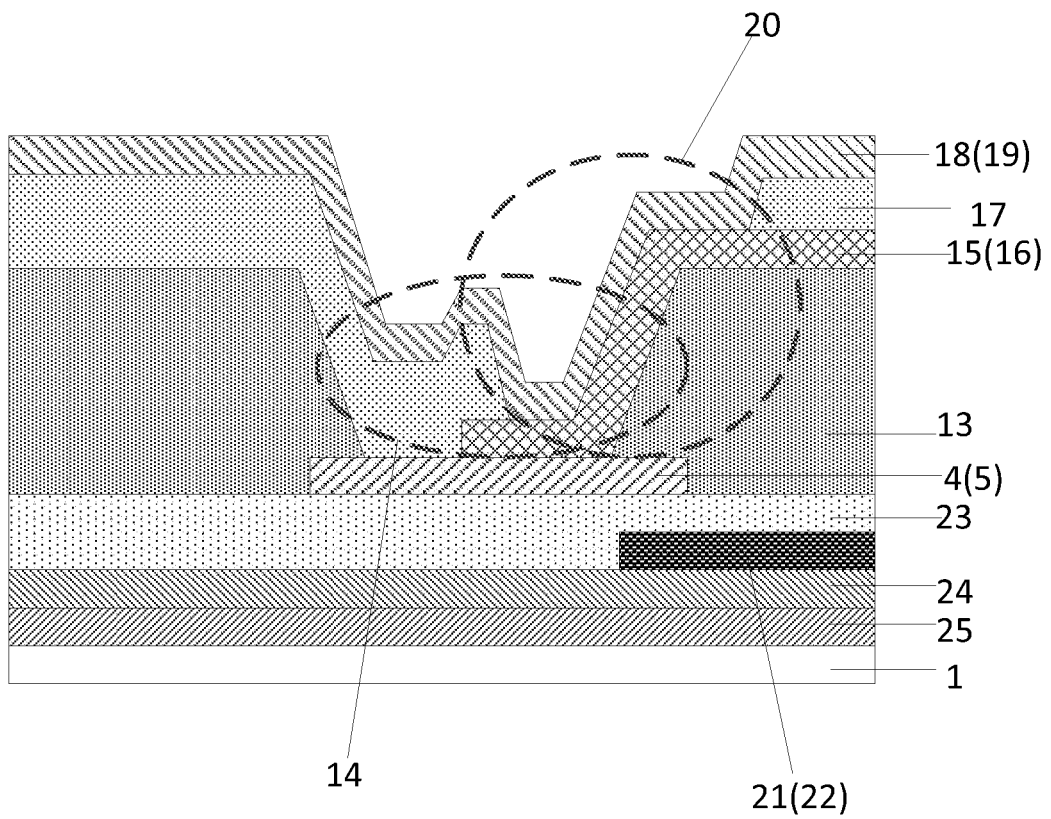
FIG. 5 is a schematic diagram of a structure of another display substrate according to an embodiment of the present disclosure.

Apparently, the thin film transistor may have a top gate structure as well. As shown in FIG. 5, the display substrate further includes:
  a fourth insulation layer 24 that is located between the fourth electrode layer 21 and the base substrate 1;
  a buffer layer 25 that is located between the fourth insulation layer 24 and the base substrate 1; and
  an active layer (not shown) that is located between the buffer layer 25 and the fourth electrode layer 21.

When the thin film transistor has the top gate structure, the third insulation layer is an interlayer insulation layer, and the fourth insulation layer is the gate insulation layer.

In some embodiments, as shown in FIG. 4, the second signal lines 22 intersect with the data signal lines 26. That is, the second signal lines 22 extend in the second direction X and the plurality of second signal lines 22 are arranged in the first direction Y.

It should be noted that the second signal lines provide a scanning signal to gates of thin film transistors.

In practice, as shown in FIGS. 1 and 4, the plurality of data signal lines 26 and the plurality of second signal lines 22 intersected with each other in the display region B horizontally and vertically divide the display region B into a plurality of sub-pixel units 29 arranged in an array. The thin film transistors, the first via holes, the second via holes, and the third via holes are in one-to-one correspondence to the sub-pixel units. All of the thin film transistors, the first via holes, the second via holes, and the third via holes are disposed in a non-aperture region of the sub-pixel units.

Figure 6:
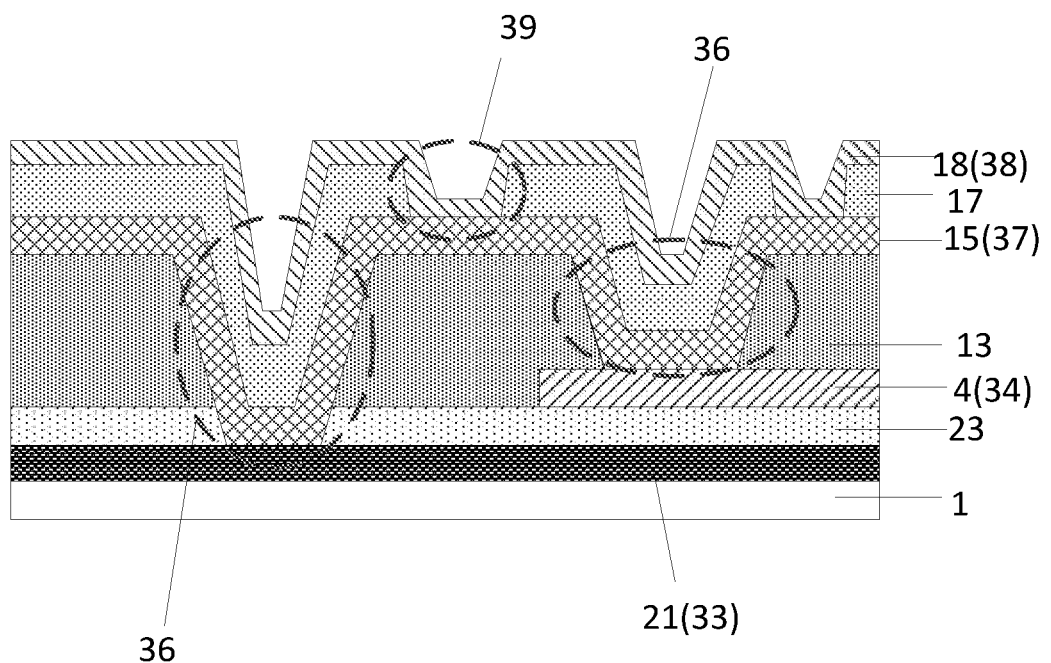
FIG. 6 is a schematic diagram of a structure of another display substrate according to an embodiment of the present disclosure.

In some embodiments, as shown in FIG. 6, the fourth electrode layer 21 further includes a plurality of first gate drive signal lines 33 located in peripheral region.

The first electrode layer 4 further includes a plurality of second gate drive signal lines 34 located in the peripheral region.

The first insulation layer 13 further includes a plurality of fourth via holes 35 penetrating the thickness of the first insulation layer 13 and exposing the second gate drive signal lines 34.

The first insulation layer 13 and the third insulation layer 23 further include a plurality of fifth via holes 36 penetrating through the first insulation layer 13 and the third insulation layer 23 and exposing the first gate drive signal lines 33.

The second electrode layer 15 further includes a plurality of gate drive circuit connection leads 37 located in the peripheral region. Each of the gate drive circuit connection leads 37 is electrically connected to a first gate drive signal line 33 through a fifth via hole 36 and electrically connected to a second gate drive signal line 34 through a fourth via hole 35.

Figure 2:
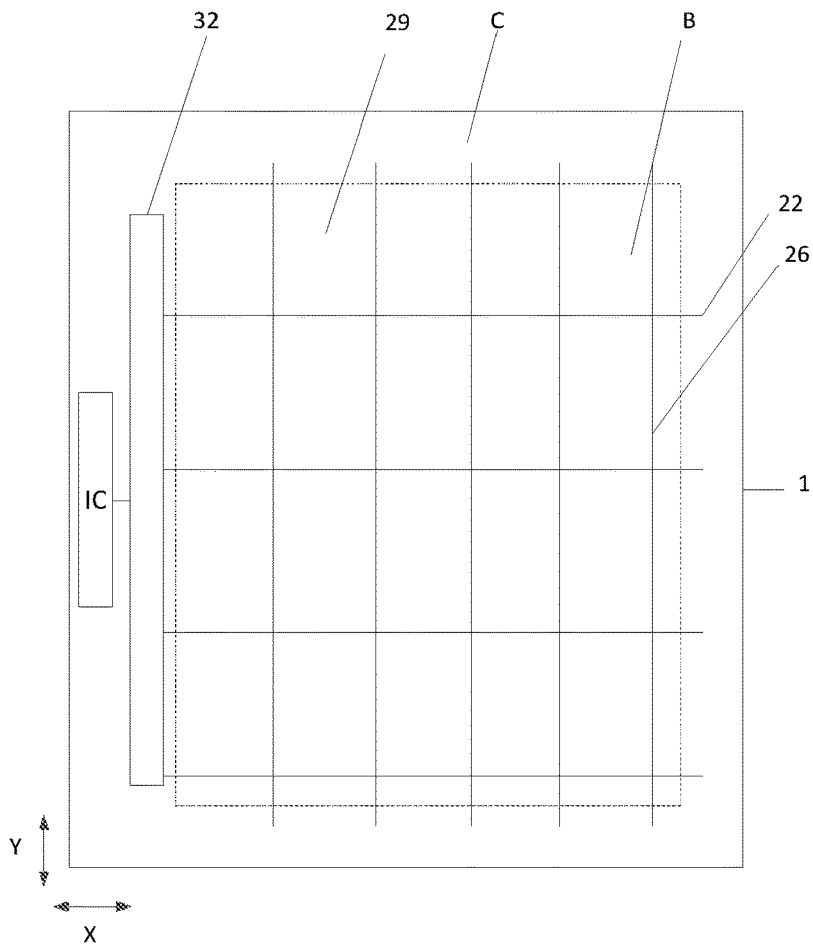
FIG. 2 is a schematic diagram of a display substrate according to an embodiment of the present disclosure.

It should be noted that, as shown in FIG. 2, a gate drive circuit 32 electrically connected to the second signal lines 22 is provided in the peripheral region C on a side in an extending direction of the second signal lines 22, and the gate drive signal lines are electrically connected to the gate drive circuit 32. In some embodiments, the gate drive signal lines are required to be in a double-layer wiring that includes the first gate drive signal lines and the second gate drive signal lines, which are electrically connected through the gate drive circuit connection leads. In practice, a first gate drive signal line and a second gate drive signal line which electrically connected to each other may serve as signal lines such as start signal (STV) lines, clock signal (CLK) lines, etc.

According to the display substrate provided in the embodiment of the disclosure, the gate drive circuit connection leads are disposed in the second electrode layer, so that the second insulation layer disposed on the gate drive circuit connection leads can protect the gate drive circuit connection leads from electrochemical corrosion of the gate drive circuit connection leads at high temperature and high humidity in a manufacturing process of the display substrate, and improve a yield of the display substrate.

In some embodiments, as shown in FIG. 6, the second insulation layer 17 further includes sixth via holes 39 penetrating the thickness of the second insulation layer 17 and exposing the gate drive circuit connection leads 37.

The third electrode layer 18 further includes a plurality of bonding electrodes 38 located in the peripheral region. The bonding electrodes 38 are electrically connected to the gate drive circuit connection leads 37 through the sixth via holes 39.

It should be noted that, as shown in FIG. 2, a driver chip IC bonded to the display substrate is also provided in the peripheral region C on the side in the extending direction of the second signal line 22. In a region where the driver chip IC is bonded, the display substrate is provided with a bonding electrode bonded to the driver chip IC, and the bonding electrode is electrically connected to a gate drive circuit connection lead, so that signals can be provided to the gate drive circuit through the driver chip IC.

It should be noted that, in the related technologies, bonding electrodes disposed in the third electrode layer are in direct contact with the fourth electrode layer and the first electrode layer through via holes, such that it is necessary to remove a large insulation layer between the third electrode layer and the fourth electrode layer or the first electrode layer, which is prone to a risk of over-etching. According to the display substrate provided in the embodiments of the present disclosure, the connection leads disposed in the second electrode layer are electrically connected to the first electrode layer and the fourth electrode layer, and the bonding electrodes disposed in the third electrode layer are electrically connected to the connection leads in the second electrode layer, so that the risk of over-etching can be avoided and the yield of the display substrate can be improved.

In practice, in the manufacturing process of the display substrate, a patterning process is required, for example, exposure by using a mask is required. In an alignment process of two film layers, a deviation from an expected position occurs due to an influence of an alignment accuracy of equipment, and an alignment deviation in a worst case is called a maximum shift. In a conventional mask exposure in the prior art, for a thin film transistor with a bottom gate structure, the fourth electrode layer is a film layer that is required to be patterned at first, and all subsequent films are aligned with the fourth electrode layer with a pattern of the fourth electrode layer used as a basis. In the embodiment of the present disclosure, a limit position influenced by the maximum shift is a relative relationship between the first via hole, the second via hole and the first electrode layer, so that after the first electrode layer is manufactured, by providing an alignment mark of the first electrode layer, subsequent film layers can be aligned with the alignment mark of the first electrode layer.

Based on the same inventive concept, a display panel is further provided in an embodiment of the present disclosure. The display panel includes:

the display substrate provided in the embodiments of the present disclosure;

an opposite substrate disposed opposite to the display substrate; and a liquid crystal layer located between the display substrate and the opposite substrate.

In some embodiments, the opposite substrate includes:

a black matrix, wherein an orthographic projection of the black matrix on the base substrate of the display substrate covers the orthographic projection of the first via holes of the display substrate on the base substrate, and covers the orthographic projection of the second via holes of the display substrate on the base substrate.

The black matrix includes a light shading material, and the first electrode layer and the second electrode layer generally include a metallic material. The orthographic projection of the black matrix on the base substrate of the display substrate covers the orthographic projection of the first via holes on the base substrate, and covers the orthographic projection of the second via holes on the base substrate, thereby shielding patterns of a first electrode layer and a second electrode layer in a via hole region, and preventing light leakage of the first electrode layer and the second electrode layer.

In practice, the black matrix further covers the first signal lines, the second signal lines and the data signal lines.

In some embodiments, as shown in FIG. 4, in the extending direction of the first signal lines of the display substrate, a minimum distance between an edge 30 of the black matrix and the first via holes covered by the black matrix is greater than or equal to 1.9 microns.

In some embodiments, a width of the black matrix is greater than or equal to 20.8 microns and less than or equal to 26 microns in the extending direction of the first signal lines of the display substrate.

It should be noted that, in the prior art, the area of the second via hole that is required to cover the first via hole is larger, and the area of the black matrix that is required to cover the first via hole and the second via hole is larger correspondingly. The width of the black matrix in the extending direction of the first signal lines is wider, and required to be 26 microns at least. Due to the reduced areas of the first via holes, the second via holes, and the region where the first via holes is overlapped with the second via holes compared with the prior art, the display panel provided in the embodiments of the present disclosure can reduce the width of the black matrix in the extending direction of the first signal lines correspondingly. When the width of the black matrix in the extending direction of the first signal lines is reduced to 20.8 microns, the aperture ratio of the display panel can be greatly improved compared with the prior art.

A display device is provided in an embodiment of the present disclosure, including the display panel provided in the embodiments of the present disclosure.

The display device provided in the embodiments of the present application is any product or component with a display function, such as a mobile phone, a tablet computer, a television, a display, a laptop computer, a digital photo frame, a navigator, etc. Other essential components of the display device as understood by those of ordinary skills in the art, which are not described in detail here and also should not be used as limitations on the present application. An implementation of the display device can refer to the embodiments of the display substrate and display panel above-mentioned, and repetitions will not be repeated again.

To sum up, in the display substrate, the display panel and the display device provided in the embodiments of the present disclosure, the orthographic projection of the first via holes on the base substrate and the orthographic projection of the second via holes on the substrate are arranged in a staggered manner. That is, the orthographic projection of the second via holes on the base substrate is not required to cover and surround the orthographic projection of the first via holes on the base substrate completely, such that the area of the second via holes of the display substrate provided in the embodiment of the present disclosure can be reduced compared with the related technologies. In this way, the area of the region where the black matrix covers the first via holes and the second via holes can be reduced, thus improving the area of the region not covered by the black matrix, thereby improving the aperture ratio of the display product and improving the display effect of the display product.

Although preferred embodiments of the present application have been described, those skilled in the art may make additional changes and modifications to these embodiments once the underlying inventive concepts are known. Therefore, the appended claims are intended to be interpreted to encompass preferred embodiments as well as all changes and modifications falling within the scope of the present application.

Apparently, those skilled in the art can make various modifications and variations to the embodiments of the present application without departing from the spirit and scope of the embodiments of the present application. Thus, if these modifications and variations to the embodiments of the present application fall within the scope of the claims of the present application and their equivalent techniques, the present application is intended to include these modifications and variations.

The invention claimed is:

1. A display substrate, comprising:
a base substrate, comprising a display region and a peripheral region outside the display region;
a first electrode layer, which is located on a side of the base substrate and comprises a plurality of first signal lines extending from the display region to the peripheral region;
a first insulation layer, which is located on a side of the first electrode layer facing away from the base substrate and comprises a plurality of first via holes penetrating a thickness of the first insulation layer, wherein an orthographic projection of at least one first via hole of the plurality of first via holes on the base substrate falls within an orthographic projection of at least one first signal line of the plurality of first signal lines on the base substrate;
a second electrode layer, which is located on a side of the first insulation layer facing away from the first electrode layer and comprises a plurality of first connection electrodes located in the display region, wherein at least one first connection electrode of the plurality of first connection electrodes is connected to the at least one first signal line through the at least one first via hole, the at least one first connection electrode covers a first portion of the at least one first via hole, the at least one first connection electrode does not cover a second portion of the at least one first via hole, and the orthographic projection of the at least one first via hole on the base substrate is partially overlapped with an orthographic projection of the at least one first connection electrode on the base substrate;
a second insulation layer, which is located on a side of the second electrode layer facing away from the first insulation layer, wherein the second insulation layer covers the second portion of the at least one first via hole, and the second insulation layer comprises a plurality of second via holes penetrating a thickness of the second insulation layer; wherein an orthographic projection of at least one second via hole of the plurality of second via holes on the base substrate falls within the orthographic projection of the at least one first connection electrode on the base substrate, the orthographic projection of the at least one second via hole on the base substrate and the orthographic projection of the at least one first via hole on the base substrate are arranged in a staggered manner, at least a portion of the orthographic projection of the at least one second via hole on the base substrate does not fall within the orthographic projection of the at least one first via hole on the base substrate, and at least a portion of the orthographic projection of the at least one first via hole on the base substrate is not covered by the orthographic projection of the at least one second via hole on the base substrate; and a third electrode layer, which is located on a side of the second insulation layer facing away from the second electrode layer and comprises a plurality of first electrodes located in the display region, wherein at least one first electrode of the plurality of first electrodes is electrically connected to the at least one first connection electrode through the at least one second via hole.

2. The display substrate of claim 1, wherein in the at least one first via hole, the at least one first connection electrode is electrically connected to a portion of the at least one first signal line exposed from the at least one first via hole.

3. The display substrate of claim 1, wherein a region where the orthographic projection of the at least one first via hole on the base substrate is overlapped with the orthographic projection of the at least one second via hole on the base substrate falls within an orthographic projection of a region where the at least one first connection electrode is electrically connected to the at least one first signal line, on the base substrate.

4. The display substrate of claim 3, wherein a contact area of the at least one first connection electrode with the at least one first signal line is greater than or equal to 9 square microns and less than or equal to 20 square microns.

5. The display substrate of claim 1, wherein the first electrode layer further comprises a source and a drain of a thin film transistor, and a plurality of data signal lines electrically connected to the source; wherein an extending direction of the data signal lines is the same as an extending direction of the at least one first signal line;

the first insulation layer further comprises a third via hole penetrating the thickness of the first insulation layer and exposing the drain;
the second electrode layer further comprises a pixel electrode electrically connected to the drain through the third via hole; and
a minimum distance between any pixel electrode and first connection electrode which are adjacent is greater than or equal to 4.5 microns.

6. The display substrate of claim 5, wherein an area of the orthographic projection of the at least one first via hole on the base substrate is greater than or equal to 29 square microns and less than or equal to 59 square microns;
an area of an orthographic projection of the third via hole on the base substrate is greater than or equal to 29 square microns and less than or equal to 59 square microns;
an area of the orthographic projection of the at least one second via hole on the base substrate is greater than or equal to 18 square microns and less than or equal to 38 square microns; and
an area of the region where the orthographic projection of the at least one second via hole on the base substrate is overlapped with the orthographic projection of the at least one first via hole on the base substrate is greater than or equal to 7 square microns, and less than or equal to 26 square microns.

7. The display substrate of claim 1, further comprising:
a fourth electrode layer, which is located between the base substrate and the first electrode layer, and comprises a plurality of first gate drive signal lines located in the peripheral region; wherein the plurality of first signal lines are intersected with a plurality of second signal lines;
a third insulation layer located between the fourth electrode layer and the first electrode layer;
the first electrode layer further comprises a plurality of second gate drive signal lines located in the peripheral region;
the first insulation layer further comprises a plurality of fourth via holes penetrating a thickness of the first insulation layer and exposing the second gate drive signal lines;
the first insulation layer and the third insulation layer further comprise a plurality of fifth via holes penetrating the first insulation layer and the third insulation layer and exposing the first gate drive signal lines; and
the second electrode layer further comprises a plurality of gate drive circuit connection leads located in the peripheral region, wherein each of the gate drive circuit connection leads is electrically connected to one of the first gate drive signal lines through a fifth via hole and to one of the second gate drive signal lines through a fourth via hole.

8. The display substrate of claim 7, wherein the second insulation layer further comprises sixth via holes penetrating the thickness of the second insulation layer and exposing the first connection electrodes; and
the third electrode layer further comprises a plurality of bonding electrodes located in the peripheral region, wherein the bonding electrodes are electrically connected to the gate drive circuit connection leads through the sixth via holes.

9. A display panel, comprising:
the display substrate of claim 1;
an opposite substrate disposed opposite to the display substrate; and
a liquid crystal layer located between the display substrate and the opposite substrate.

10. The display panel of claim 9, wherein the opposite substrate comprises:
a black matrix, wherein an orthographic projection of the black matrix on the base substrate of the display substrate covers the orthographic projection of the at least one first via hole of the display substrate on the base substrate, and covers the orthographic projection of the at least one second via hole of the display substrate on the base substrate.

11. The display panel of claim 10, wherein a minimum distance between an edge of the black matrix and the at least one first via hole covered by the black matrix in an extending direction of the at least one first signal line of the display substrate is greater than or equal to 1.9 microns.

12. The display panel of claim 10, wherein a width of the black matrix is greater than or equal to 20.8 microns and less than or equal to 26 microns in an extending direction of the at least one first signal line of the display substrate.

13. A display device, comprising the display panel of claim 9.

14. The display substrate of claim 2, wherein the first electrode layer further comprises a source and a drain of a thin film transistor, and a plurality of data signal lines electrically connected to the source; wherein an extending direction of the data signal lines is the same as an extending direction of the at least one first signal line;
the first insulation layer further comprises a third via hole penetrating the thickness of the first insulation layer and exposing the drain;

the second electrode layer further comprises a pixel electrode electrically connected to the drain through the third via hole; and a minimum distance between any pixel electrode and first connection electrode which are adjacent is greater than or equal to 4.5 microns.

15. The display substrate of claim 7, wherein the first electrode layer further comprises a source and a drain of a thin film transistor, and a plurality of data signal lines electrically connected to the source; wherein an extending direction of the data signal lines is the same as an extending direction of the at least one first signal line;

the first insulation layer further comprises a third via hole penetrating the thickness of the first insulation layer and exposing the drain;

the second electrode layer further comprises a pixel electrode electrically connected to the drain through the third via hole; and a minimum distance between any pixel electrode and first connection electrode which are adjacent is greater than or equal to 4.5 microns.

16. The display substrate of claim 3, wherein the first electrode layer further comprises a source and a drain of a thin film transistor, and a plurality of data signal lines electrically connected to the source; wherein an extending direction of the data signal lines is the same as an extending direction of the at least one first signal line;

the first insulation layer further comprises a third via hole penetrating the thickness of the first insulation layer and exposing the drain;

the second electrode layer further comprises a pixel electrode electrically connected to the drain through the third via hole; and a minimum distance between any pixel electrode and first connection electrode which are adjacent is greater than or equal to 4.5 microns.

17. The display substrate of claim 4, wherein the first electrode layer further comprises a source and a drain of a thin film transistor, and a plurality of data signal lines electrically connected to the source; wherein an extending direction of the data signal lines is the same as an extending direction of the at least one first signal line;

the first insulation layer further comprises a third via hole penetrating the thickness of the first insulation layer and exposing the drain;

the second electrode layer further comprises a pixel electrode electrically connected to the drain through the third via hole; and a minimum distance between any pixel electrode and first connection electrode which are adjacent is greater than or equal to 4.5 microns.

18. The display substrate of claim 2, further comprising:

a fourth electrode layer, which is located between the base substrate and the first electrode layer, and comprises a plurality of first gate drive signal lines located in the peripheral region; wherein the plurality of first signal lines are intersected with a plurality of second signal lines;

a third insulation layer located between the fourth electrode layer and the first electrode layer;

the first electrode layer further comprises a plurality of second gate drive signal lines located in the peripheral region;

the first insulation layer further comprises a plurality of fourth via holes penetrating the thickness of the first insulation layer and exposing the second gate drive signal lines;

the first insulation layer and the third insulation layer further comprise a plurality of fifth via holes penetrating the first insulation layer and the third insulation layer and exposing the first gate drive signal lines; and the second electrode layer further comprises a plurality of gate drive circuit connection leads located in the peripheral region, wherein each of the gate drive circuit connection leads is electrically connected to one of the first gate drive signal lines through a fifth via hole and to one of the second gate drive signal lines through a fourth via hole.

19. The display substrate of claim 3, further comprising:

a fourth electrode layer, which is located between the base substrate and the first electrode layer, and comprises a plurality of first gate drive signal lines located in the peripheral region; wherein the plurality of first signal lines are intersected with a plurality of second signal lines;

a third insulation layer located between the fourth electrode layer and the first electrode layer;

the first electrode layer further comprises a plurality of second gate drive signal lines located in the peripheral region;

the first insulation layer further comprises a plurality of fourth via holes penetrating the thickness of the first insulation layer and exposing the second gate drive signal lines;

the first insulation layer and the third insulation layer further comprise a plurality of fifth via holes penetrating the first insulation layer and the third insulation layer and exposing the first gate drive signal lines; and the second electrode layer further comprises a plurality of gate drive circuit connection leads located in the peripheral region, wherein each of the gate drive circuit connection leads is electrically connected to one of the first gate drive signal lines through a fifth via hole and to one of the second gate drive signal lines through a fourth via hole.

* * * * *